United States Patent
Töpfer et al.

[11] Patent Number: 5,959,352
[45] Date of Patent: Sep. 28, 1999

[54] CHIP ARRANGEMENT AND METHOD OF PRODUCING THE SAME

[75] Inventors: Manfred Töpfer, Nauen; Eberhard Kaulfersch, Chemnitz; Stefan Weib; Herbert Reichl, both of Berlin, all of Germany

[73] Assignee: Fraunhofer-Gesellschaft Zur Förderung Der Angewandten Forschung E.V., München, Germany

[21] Appl. No.: 08/986,204

[22] Filed: Dec. 5, 1997

[30] Foreign Application Priority Data

Dec. 11, 1996 [DE] Germany .................. 196 51 528

[51] Int. Cl.$^6$ ................................. H01L 23/48
[52] U.S. Cl. .............. 257/717; 257/777; 257/778; 257/779; 257/783
[58] Field of Search ................... 257/717, 734, 257/737, 738, 777–783, 686, 685, 704–730, 700, 701

[56] References Cited

U.S. PATENT DOCUMENTS

| | | | |
|---|---|---|---|
| 4,960,643 | 10/1990 | Lemelson | 428/408 |
| 4,979,015 | 12/1990 | Stierman et al. | 257/778 |
| 5,216,807 | 6/1993 | Yoshizawa et al. | 257/778 |
| 5,240,749 | 8/1993 | Chow | 427/575 |
| 5,324,987 | 6/1994 | Iacovangelo et al. | 257/701 |
| 5,532,512 | 7/1996 | Fillion et al. | 257/686 |
| 5,656,862 | 8/1997 | Papathomas | 257/778 |
| 5,773,896 | 6/1998 | Fujimoto et al. | 257/777 |
| 5,841,197 | 11/1998 | Adamic, Jr. | 257/777 |

OTHER PUBLICATIONS

"Direct Chip Interconnect With Adhesive Conductor Films" by Nagesh R. Basavanhally, David Chang, Ben Cranston and Steve Segar, Jr., in IEEE Transactions on Components, Hybrids, and Manufacturing Technology, vol. 15, No. 6, Dec. 1992, pp. 972–976.

"Mounting of High Power Laser Diodes on Diamond Heatsinks" by Stefan Weib, Elke Zakel and Herbert Reichl in IEEE Transactions on Components, Packaging, and Manufacturing Technology—Part A, vol. 19, no. 1, Mar. 1996, pp. 46–53.

Primary Examiner—Alexander Oscar Williams
Attorney, Agent, or Firm—Duft, Graziano & Forest, P.C.

[57] ABSTRACT

A chip arrangement has a first chip, a connecting device and at least a second chip or a substrate. The connecting device has a plurality of individual, spaced diamond parts which are arranged between the chips or between the first chip and the substrate and are connected to these such that the chips or the chip and the substrate are connected together via the diamond parts only. Methods for producing a chip arrangement of this kind comprise either the application of a diamond layer over the whole surface of the substrate and the subsequent structuring of the diamond layer to define individual, spaced diamond parts or the application of individual diamond parts to either the first chip or the second chip or the substrate such that they are arranged in spaced relationship with one another. The individual, spaced diamond parts are subsequently connected to the other component which is to be connected such that they are connected via the diamond parts only. A method of this kind is particularly suitable for connecting a high-power chip to a heat sink.

11 Claims, 1 Drawing Sheet

CHIP ARRANGEMENT AND METHOD OF PRODUCING THE SAME

DESCRIPTION

1. Field of the Invention

The present invention refers to a chip arrangement in which a chip is connected to at least one other chip or to a substrate by means of a connecting device. The present invention refers also to a method for connecting a chip to another chip or to a substrate.

The present invention refers to the application area in which two or more material elements, e.g. chips, various substrate materials, IC elements, are connected together at least mechanically and/or electrically and/or thermally using the die-bond or flip-chip technique. These methods find application e.g. in the connection of two or more chips or in the mounting and/or contacting of chips on substrates, especially for the formation of multichip modules (MCMs) and in optoelectronics. The present invention is generally applicable to advantage in all areas where large components are to be mounted and/or where high power losses are to be dissipated, e.g. in the fields of application of optoelectronics and/or power electronics.

2. Description of the Prior Art

It is known that chips made of Si, GaAs or InP having high power losses must be mounted on so-called thermal fins and/or coolers, so-called heat sinks. In such a mounting arrangement the contact between the chips and the heat sink should cover as large an area as possible so as to conduct the heat efficiently to the heat sink. An accumulation of heat and too high a temperature in a chip lead to a high degradation and can cause a sudden failure.

The material elements are therefore soldered, since solders have very low thermal and very low electrical resistances. The solder can be deposited galvanically or current-free, vapour-deposited or sputtered on, or, alternatively, it may be present in the form of a soldering lamina (preform). As thermal fins or coolers, materials with a high thermal conductivity, e.g. Cu, cubic boron nitride or diamond, are used.

However, there exist here in some cases very large differences in the coefficients of expansion of the material elements. In order to accommodate the thermomechanical stresses induced by the soldering process and arising in operation due to the different coefficients of expansion, a soft solder material with a low flow limit must be employed. For example, when mounting high-energy laser bars made of AlGaAs/GaAs or InGaAs/GaAs it is standard practice to solder these onto copper (Cu) or diamond using In solder.

Due to the very soft In solder, the stresses which occur can be reduced. Nevertheless, the laser bars which are soldered using the above method have an expected service life of only 5000 hours. The reason for this short service life is the use of the In solder, which has a low reliability.

Longer lifetimes and higher reliabilities can be achieved only by using higher melting solders such as Pb(37)Sn(63) and Au(80)Sn(20). These solders have considerably higher flow limits and therefore they cannot, or only partially, reduce the induced stresses. For applications in optoelectronics, the use of Au(80)Sn(20) solder is of very great interest, since with this it is possible to carry out a flux-free soldering process. If this solder is used to solder GaAs to diamond, the stresses exceed the fracture limit of the GaAs from a certain chip size, which depends on the thicknesses of the material elements, onwards. With skillful choice of the soldering parameters, temperature and time it is possible to reduce the stresses to just below the fracture limit. For optically active material elements the stresses must, however, be reduced by a factor of 2 to 4 for the chip to be functional.

SUMMARY OF THE INVENTION

Starting from the prior art described above, it is the object of the present invention to provide a chip arrangement comprising a chip, a connecting device and at least one more chip or a substrate, where the connecting device has a very good thermal conductivity and, in addition, guarantees a long service life of the chip arrangement. It is a further object of the present invention to provide methods for connecting a chip to a substrate or to another chip.

In accordance with a first aspect of the invention this object is achieved by a chip arrangement comprising a first chip, a connecting device and at least a second chip or a substrate, where the connecting device comprises a plurality of individual, spaced diamond parts which are arranged between the chips or between the first chip and the substrate and are connected to these in such a way that the chips or the chip and the substrate are connected together via the diamond parts only.

According to a preferred embodiment, the present invention provides a chip arrangement comprising a high-power chip and a cooling substrate which are connected together by means of a plurality of individual, spaced diamond parts. The diamond parts may be connected to the chip and/or the cooling substrate by means of a solder, e.g. Au(80)Sn(20) or Pb(37) Sn(63), or, alternatively, they may be connected to the chip and/or the cooling substrate by means of a thermo-compression bonding method.

The present invention makes possible the use of a hard gold-tin solder with a long service life, preferably with the eutectic ratio Au(80)Sn(20), to connect a first chip to a second chip or to a substrate, e.g. a heat sink, using a diamond material. The second chip or the substrate preferably has a thermal coefficient of expansion which is substantially the same as that of the first chip so as to avoid introducing any stresses in the chip, which could lead to fracturing of the chip.

The present invention thus makes possible e.g. the advantageous mounting of high-energy laser bars, which for typical dimensions of 10 mm·0.6 mm·100 μm may have a power loss of 50 W, on a heat sink, which is made e.g. of silicon or AlN. For mounting a high-energy laser bar made of GaAs on a heat sink made of silicon or AlN, the individual, spaced diamond parts preferably have a diameter ≦2 mm.

In accordance with a second aspect the present invention provides a method for connecting a first chip to a second chip or a substrate comprising the steps of applying individual diamond parts to the first chip or to the second chip or to the substrate such that they are arranged in spaced relationship with one another, and connecting the individual, spaced diamond parts to the other of the two chips or to the substrate in such a way that the chips or the chip and the substrate are connected together via the diamond parts only.

In accordance with a third aspect the present invention provides a method for connecting a first chip to a second chip or a substrate comprising the steps of applying individual diamond parts to the first chip or to the second chip or to the substrate such that they are arranged in spaced relationship with one another, and connecting the individual, spaced diamond parts to the other of the two chips or to the substrate in such a way that the chips or the chip and the substrate are connected together via the diamond parts only.

The present invention thus provides methods which are particularly advantageous for connecting to cooling substrates components having a high power loss. The present invention enables the thermomechanical stresses on the diamond layer to be reduced through the singularization of the diamond layer into individual, spaced diamond parts. As a result the present invention makes possible the use of a higher melting solder and thus a high reliability of contacting. Consequently the electrical and thermal resistances are very low.

BRIEF DESCRIPTION OF THE DRAWINGS

A preferred embodiment of the present invention will be explained in more detail below making reference to the enclosed drawings, in which.

DESCRIPTION OF PREFERRED EMBODIMENTS OF THE INVENTION

The present invention will be explained in more detail below on the basis of a preferred embodiment of the same relating to the mounting of a high-energy laser bar on a heat sink.

Figure 1:
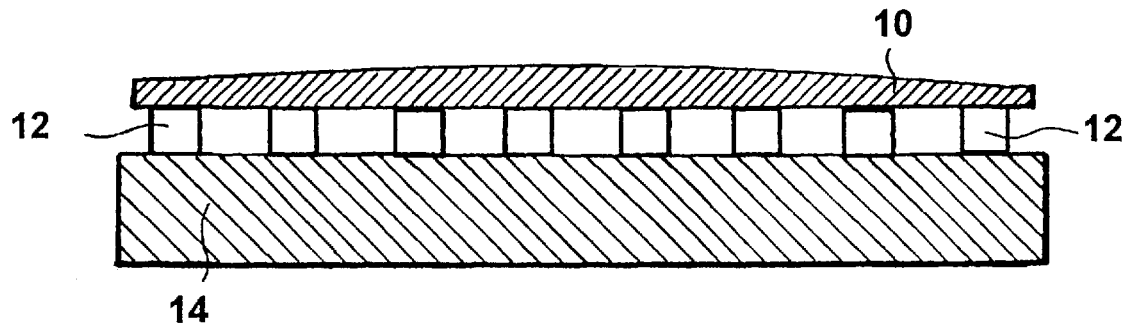
FIG. 1 shows a schematic cross-sectional view of a high-energy laser bar which has been applied to a heat sink by means of the method according to the present invention.

FIG. 1 shows a high-energy laser bar 10 applied to a heat sink 14, which can also be described as a cooling substrate, by means of individual, spaced diamond parts 12. The high-energy laser bar 10 is made e.g. of AlGaAs/GaAs or InGaAs/GaAs. The heat sink 14 is made preferably of silicon or AlN. Preferred methods for producing the chip arrangement shown in FIG. 1 will be explained below.

Figure 2:
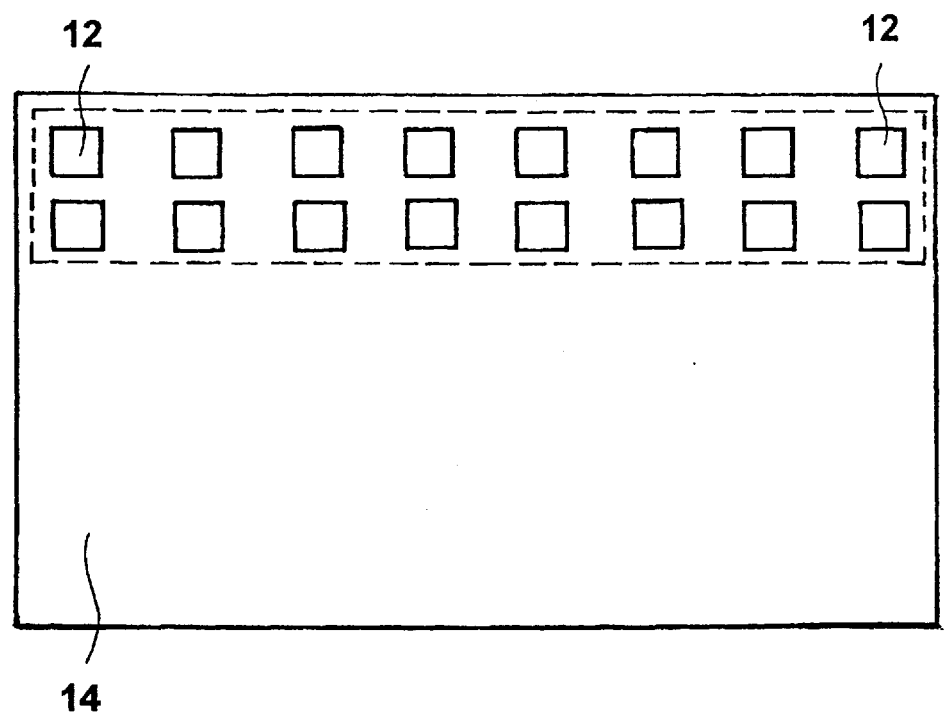
FIG. 2 shows a schematic top view of the heat sink with individual, spaced diamond parts applied thereto.

FIG. 2 shows a top view of the heat sink 14 having applied thereto the individual, spaced diamond parts 12, the high-energy laser bar 10 having been removed. The diamond parts 12 may have been produced e.g. by the structuring of a diamond layer, covering the whole area, which was deposited on the cooling substrate 14.

In a preferred method for producing the chip arrangement shown in FIG. 1, a CVD diamond layer covering the whole area is first deposited on a heat sink, which is made e.g. of Si or AlN. Subsequently a structuring of the diamond layer is carried out by means of mechanical processing, e.g. with a laser beam, so as to form individual, spaced diamond parts of the same height. Alternatively, masking processes can be used before deposition so as to deposit on the heat sink already structured individual, spaced diamond parts. Subsequently, cooling elements can be produced, by mechanical or by etching methods, from the diamond-covered substrate, which later serves as the heat sink.

Following this, in the preferred embodiment a high melting solder, e.g. Au(80)Sn(20), is applied to these structured diamonds using known application techniques. The chip, i.e. in the chip arrangement shown in FIG. 1 the high-energy laser bar 10, is positioned above the cooling substrate 14 and is then soldered to the individual diamond parts. Here the chip preferably has corresponding soldering points in the corresponding regions.

Figure 3:
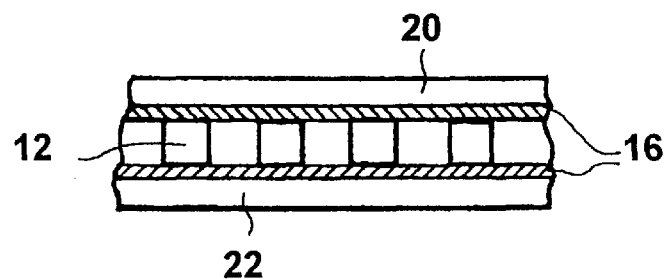
FIG. 3 shows a schematic partial cross-sectional view of components connected using a solder by means of the method according to the present invention.

FIG. 3 shows a partial cross-section of a chip arrangement in which the individual diamond parts 12 are connected to a chip 20 and a chip 22 by means of a soldering method. Each of the chips 20 and 22 has a soldering agent layer 16 applied to it, preferably made of Au(80)Sn(20).

As an alternative to the soldering method described above, the chip can also be mounted on correspondingly metallized diamonds using a thermocompression bonding method. For this purpose the individual diamond parts are provided with surface metallizations. This surface metallization is preferably made of gold. Furthermore, the chip which is to be connected to the individual diamond parts also has gold contacts. These gold contacts of the chip are aligned with the surface metallizations of the diamond parts and the chip is then bonded to the surface-metallized diamond parts using a thermocompression bonding method.

In contrast to the methods described above, individual diamond parts may also first be erected on a substrate, e.g. a copper substrate, in sizes and structures which have been optimized for constructing the subsequent chip arrangement. If the substrate is to be used as a heat sink for the high-energy laser bar described above, for example, it is even more preferable to use tungsten-copper or molybdenum-copper as the substrate compared with copper on account of the thermal coefficient of expansion. Once a solder has been applied to the diamond parts, these can be soldered to a chip. Alternatively, the solder can also be applied before the diamond parts are erected on the copper substrate.

In yet a further alternative method according to the present invention, individual, spaced diamond parts are first connected to a chip, e.g. to the high-energy laser bar 10. This connection can e.g. again be performed by means of soldering techniques or thermocompression bonding methods. Afterwards the diamond parts, which in turn, depending on what follows, are provided with a surface metallization for a subsequent thermocompression bonding method or with a soldering agent for a subsequent soldering method, are connected to the cooling substrate. In the method according to the present invention it is also possible to use a soft solder, e.g. an In solder, between the cooling substrate and the individual, spaced diamond parts, so as to reduce thermal stresses still further, since this soft solder between the individual diamond parts and the substrate does not adversely affect the service life of the arrangement.

The methods cited above for producing the chip arrangement according to the present invention only serve as examples; other materials and a different sequence of the cited steps can also be used to effect a chip arrangement according to the present invention.

What is claimed is:

1. A chip arrangement comprising a first chip, a material element selected from the group consisting of a second chip and a substrate, and a connecting device connecting said first chip and said material element, wherein the connecting device comprises a plurality of individual, spaced diamond parts which are arranged between said first chip and said material element and are connected to these in such a way that said first chip and said material element are connected together via the diamond parts only.

2. A chip arrangement according to claim 1, wherein the first chip is a high-power chip and the substrate is a cooling substrate.

3. A chip arrangement according to claim 2, wherein the cooling substrate has a thermal coefficient of expansion which is substantially the same as that of the high-power chip.

4. A chip arrangement according to claim 1, wherein the individual, spaced diamond parts are connected to said first chip and said material element by means of a solder.

5. A chip arrangement according to claim 4, wherein the solder used is Au(80)Sn(20) or Pb(37)Sn(63).

6. A chip arrangement according to claim 1, wherein the individual, spaced diamond parts are connected to said first chip and said material element by means of a thermocompression bonding method.

7. A chip arrangement according to claim 2, wherein the cooling substrate is made of Si or AlN.

8. A chip arrangement according to claim 2, wherein the high-power chip is a high-energy laser bar made of AlGaAs/GaAs or InGaAs/GaAs.

9. A chip arrangement according to claim 2, wherein the cooling substrate is made of copper, tungsten-copper or molybdenum-copper.

10. A chip arrangement comprising a first chip, a connecting device and a second chip, wherein the connecting device comprises a plurality of individual, spaced diamond parts which are arranged between said first and second chips and are connected to these in such a way that said chips are connected together via said diamond parts only.

11. An arrangement for connecting electronic and optoelectronic material elements, said arrangement comprising: a first material element selected from the group consisting of a substrate, an optoelectronic element, and an electronic chip, a second material element selected from the group consisting of an optoelectronic element and an electronic chip, and a connecting device connecting said first material element and said second material element, wherein the connecting device comprises a plurality of individual, spaced diamond parts which are arranged between said first material element and said second material element and are connected to these in such a way that the first material element and the second material element are connected together via essentially the diamond parts only.

* * * * *